United States Patent [19]

Murase et al.

[11] Patent Number: 4,894,524
[45] Date of Patent: Jan. 16, 1990

[54] LASER RECORDING APPARATUS WITH LASER INTENSITY CONTROL

[75] Inventors: Masakazu Murase; Takashi Shoji, both of Kanagawa, Japan

[73] Assignee: Fuji Photo Film Co., Ltd., Kanagawa, Japan

[21] Appl. No.: 259,632

[22] Filed: Oct. 19, 1988

[30] Foreign Application Priority Data

Oct. 20, 1987 [JP] Japan .................................. 62-265008

[51] Int. Cl.[4] .......................... G05D 25/02; H01J 40/14
[52] U.S. Cl. ..................................... 250/205; 346/108
[58] Field of Search ........ 250/214 AG, 205, 235-236; 346/108, 160; 372/29

[56] References Cited

U.S. PATENT DOCUMENTS

| | | | |
|---|---|---|---|
| 4,443,695 | 4/1984 | Kitamura | 250/214 AG |
| 4,695,714 | 9/1987 | Kimizuka et al. | 250/205 |
| 4,710,779 | 12/1987 | Funaki et al. | 346/108 |
| 4,751,377 | 6/1988 | Ishizaka et al. | 250/205 |

Primary Examiner—Edward P. Westin
Attorney, Agent, or Firm—Sughrue, Mion, Zinn, Macpeak & Seas

[57] ABSTRACT

A laser recording apparatus for recording a continuous tone image on a photosensitive material by scanning the material with an analog light beam which was intensity-modulated on the basis of an image signal is disclosed. The apparatus uses a semiconductor laser as a light beam source, and the emission light level of the semiconductor laser is controlled according to an image signal by making use of the charging and discharging of a capacitor and without making use of the well-known APC circuit. Thus, the apparatus is free from the problem of circuit oscillation that arises when using an APC circuit and permits a repeatedly increasing and decreasing emission light level instruction signal to be followed by the semiconductor emission light level accurately and with a satisfactory response speed, so that it is possible to record a continuous tone image at a high speed and with high accuracy.

1 Claim, 2 Drawing Sheets

LASER RECORDING APPARATUS WITH LASER INTENSITY CONTROL

BACKGROUND OF THE INVENTION

1. Field of the Invention

This invention relates to a laser recording apparatus for recording a continuous tone image on a photosensitive material by scanning the photosensitive material with an analog light beam which was intensity-modulated on the basis of an image signal and, more particularly, to a laser recording apparatus, which uses a semiconductor laser as a light beam source to permit recording of the image at a high speed and with high accuracy.

2. Description of the Prior Art

Heretofore, light-beam-scanning recording apparatuses have been extensively used, in which an image is recorded on a photosensitive material by scanning the material with a light beam which was deflected by a beam deflector. In such light-beam-scanning recording apparatuses, semiconductor lasers are used as a means for generating a light beam. Semiconductor lasers are superior to gas lasers in that they are small in size and inexpensive, consume less power and are capable of direct modulation through control of the current which drives the laser, hereinafter the drive current.

On the negative side, however, the use of a semiconductor laser for the recording of a continuous tone image is difficult because the intensity of the light output, hereinafter simply called the light output, increases much more rapidly after the drive current crosses into a laser oscillation region than it does when the drive current is in a LED oscillation region as shown in FIG. 2. More specifically, if only the laser oscillation region, in which the light output varies linearly as a function of the drive current, is utilized for the light intensity modulation, it is possible to obtain a dynamic light output range of about two digits at the most. With a dynamic range of such a low order, a highly-graduated continuous tone image cannot be obtained as is well known in the art.

More specifically, in order to permit recording of a highly-graduated tone image with a density scale of, for instance, 10 bits, corresponding to 1024 graduations, it is desired to provide a dynamic light output range of, for instance, 3 digits by permitting intensity modulation of the semiconductor laser light output by the drive current over both the LED and laser oscillation regions shown in FIG. 2. However, when the two regions noted above are covered, the light output is no longer a linear function of the drive current. However, in order to accurately record an image with a highly graduated density scale, two constraints exist. First, the change in toner density (on the photoconductive surface) produced for each density graduation in a continuous tone image must be uniform across the density scale. Second, a fixed level of change in an image signal, i.e. the signal which carries information about a continuous tone image, which image is to be reproduced, must be assigned to a graduation in the toner density scale. To this end, it is desirable to convert the relation between the light output and the image signal, which indirectly controls the drive current of the semiconductor laser, into a linear one, i.e. the relation between the image signal and the drive current should not be linear.

A laser operation control circuit (APC) for creating a linear relation between an image signal and the light output is well-known in the art. Define an emission light level instruction signal for the semiconductor laser as a reference signal derived from the image signal, which image signal carries information about a continuous tone image which is to be reproduced. In the APC circuit the laser beam light intensity, i.e. the light output, is detected, and a feedback signal corresponding to the detected light intensity is fed back to a point where it is added to the light emission level instruction signal, i.e. the reference signal. FIG. 3 shows an example of the APC circuit. The APC circuit will now be described with reference to FIG. 3. An emission light level instruction signal Vref which controls the intensity level of the light emitted from a semiconductor laser 1 is supplied through an adder 2 to a voltage/current conversion amplifier 3. The amplifier 3 supplies a drive current, which is proportional to the signal Vref, to the semiconductor laser 1. The semiconductor laser 1 emits a light beam 4. The emitted light beam 4 travels through a scanning optical system (not shown) to be utilized for the scanning of a photosensitive material. Meanwhile, the intensity of a light beam 5, which is emitted from the semiconductor laser 1 in the opposite direction from that of light beam 4, is detected by, for instance, a pin photodiode 6 disposed for monitoring the intensity of the light put out by the semiconductor laser. The intensity of the light beam 5 that is detected in this way is proportional to the intensity of the light beam 4 utilized for image recording. The intensity of the light beam 5, i.e. the output current from the photodiode 6, which represents the intensity of the light beam 4, is converted by a current/voltage conversion amplifier 7 into a feedback signal (voltage signal) Vpd and then supplied to the adder 2. The adder 2 provides a difference signal Ve representing the difference between the emission light level instruction signal Vref and feedback signal Vpd. The difference signal Ve is converted by the voltage/current conversion amplifier 3 into a current for driving the semiconductor laser 1.

If an ideal linear correction could be obtained in the APC circuit described above, the intensity of the light beam 5 would be proportional to the emission light level instruction signal Vref, that is, the intensity of the light beam (i.e. light put out by the semiconductor laser 1) utilized for image recording would be proportional to the emission light level instruction signal Vref.

When an APC circuit such as that described above is used, however, high speed, accurate recording of a continuous tone image is difficult. This problem will now be described in detail. When recording a continuous tone image, the emission light level instruction signal may suddenly change. The APC circuit must respond even to sudden changes in the emission light level instruction signal if it is to accurately control the semiconductor laser drive current. To permit accurate response to the emission light level instruction signal, however, it is necessary to set an extremely high loop gain in the APC circuit. However, there is an upper limit on the loop gain because, if the loop gain of an APC circuit operating at a high speed is too high, oscillation of the circuit results. For the above reason, it is difficult when using the APC circuit to achieve a high enough response speed for accurate image recording.

SUMMARY OF THE INVENTION

In light of the above problems, the present invention has as its object the providing of a laser recording apparatus, which uses a semiconductor laser as a recording light beam source, with which laser recording apparatus high speed and highly accurate recording of a continuous tone image is possible.

To attain the above object of the invention, there is provided a laser recording apparatus, in which an emission light level instruction signal for the semiconductor laser is controlled by making use of the charging and discharging of a capacitor rather than by making use of an APC circuit, which has the problem of oscillation.

More specifically, according to the invention there is provided a laser recording apparatus for recording a continuous tone image on a photosensitive material by using an intensity-modulated light beam controlled by a semiconductor laser drive current, which drive current to derived from an emission light level instruction signal corresponding to an image signal. Said photosensitive material is then scanned with said light beam. The laser recording apparatus comprises:

a photosensor for detecting the intensity of a light beam emitted by a semiconductor laser;

a converter for converting an emission light level instruction signal into a drive current change rate instruction signal for causing the output of the semiconductor laser to be changed proportionately with and at the same rate as said emission light level instruction signal;

a non-inverting amplifier for amplifying said drive current change rate instruction signal without sign inversion;

an inverting amplifier for amplifying said drive current change rate instruction signal with sign inversion;

a driver for supplying a drive current for said semiconductor laser, in which said driver has an input line;

a first comparator for comparing an image signal for each image element and an image signal for an image element immediately succeeding said each image element in a light beam scanning direction and providing a signal C1 if the former signal is greater than the latter while providing a signal C2 in the converse case;

a second comparator for simultaneously comparing the value of said emission light level instruction signal and the output of said photosensor, which represents the intensity of the light emitted by said semiconductor laser, and providing a signal D1 if the latter level is greater than the former level while providing a signal D2 in the converse case;

positive and negative current sources;

a capacitor having one terminal connected to an input line of said driver; and a switching circuit for receiving the outputs of said first and second comparators and connecting, to said input line, one of the following: said negative current source when said signals C1 and D1 are being received, said noninverting amplifier when said signals C1 and D2 are being received, said inverting amplifier when said signals C2 and D1 are being received or said positive current source when said signals C2 and D2 are being received.

When the first comparator is providing the signal C1, the semiconductor laser light output must be increased. Right after the appearance of the signal C1, the actual emission light level, i.e. the intensity of the light emitted by the semiconductor laser, is below the value indicated by the emission light level instruction signal, so the second comparator provides the signal D2. Thus, the switching circuit connects the input line of the semiconductor laser driver circuit to the non-inverting amplifier at this time. This causes the semiconductor laser emission light level to increase quickly, and when it surpasses the value indicated by the emission light level instruction signal (hereinafter also called the instruction signal) the output of the second comparator changes from D2 to D1. As a result, the switching circuit connects the negative current source to said input line of said driver. In this way, the capacitor, which was charged while the driver was connected to the non-inverting amplifier, is discharged. As a consequence, the signal at the input line of the driver is reduced comparatively gently, and therefore the semiconductor laser emission light level is reduced gradually. Eventually the output of the second comparator is inverted from D1 to D2 again. Thus, the input line of the driver is connected again to the non-inverting amplifier to increase the semiconductor laser emission light level. In this way, the semiconductor laser emission light level is repeatedly increased and reduced with respect to an intermediate value indicated by the emission light level instruction signal.

When the first comparator is providing the signal C2, the semiconductor laser light output must be reduced. Right after the appearance of the signal C2, the actual emission light level is above the value indicated by the emission light level instruction signal, and the second comparator provides the signal D1. At this time, the switching circuit connects the input line of the semiconductor laser driver to the inverting amplifier. The semiconductor laser emission light level is thus quickly reduced at this time. When it becomes lower than the value indicated by the instruction signal, the output of the second comparator is changed from D1 to D2. As a consequence, the switching circuit connects the positive current source to the input line of semiconductor laser driver. In this way, the capacitor, which was discharged while the driver was connected to the inverting amplifier, is charged. As a result, the input signal to the driver is increased comparatively gently, and, therefore, the semiconductor laser emission light intensity level is increased gradually. Eventually the output of the second comparator is changed from D2 to D1 again. The driver is thus again connected to the inverting amplifier. In this way, the semiconductor laser emission light level is repeatedly increased and reduced with respect to an intermediate value indicated by the emission light level instruction signal.

DESCRIPTION OF THE PREFERRED EMBODIMENT

Now the invention will be described in detail in conjunction with an embodiment thereof and with reference to the accompanying drawings.

Figure 1:
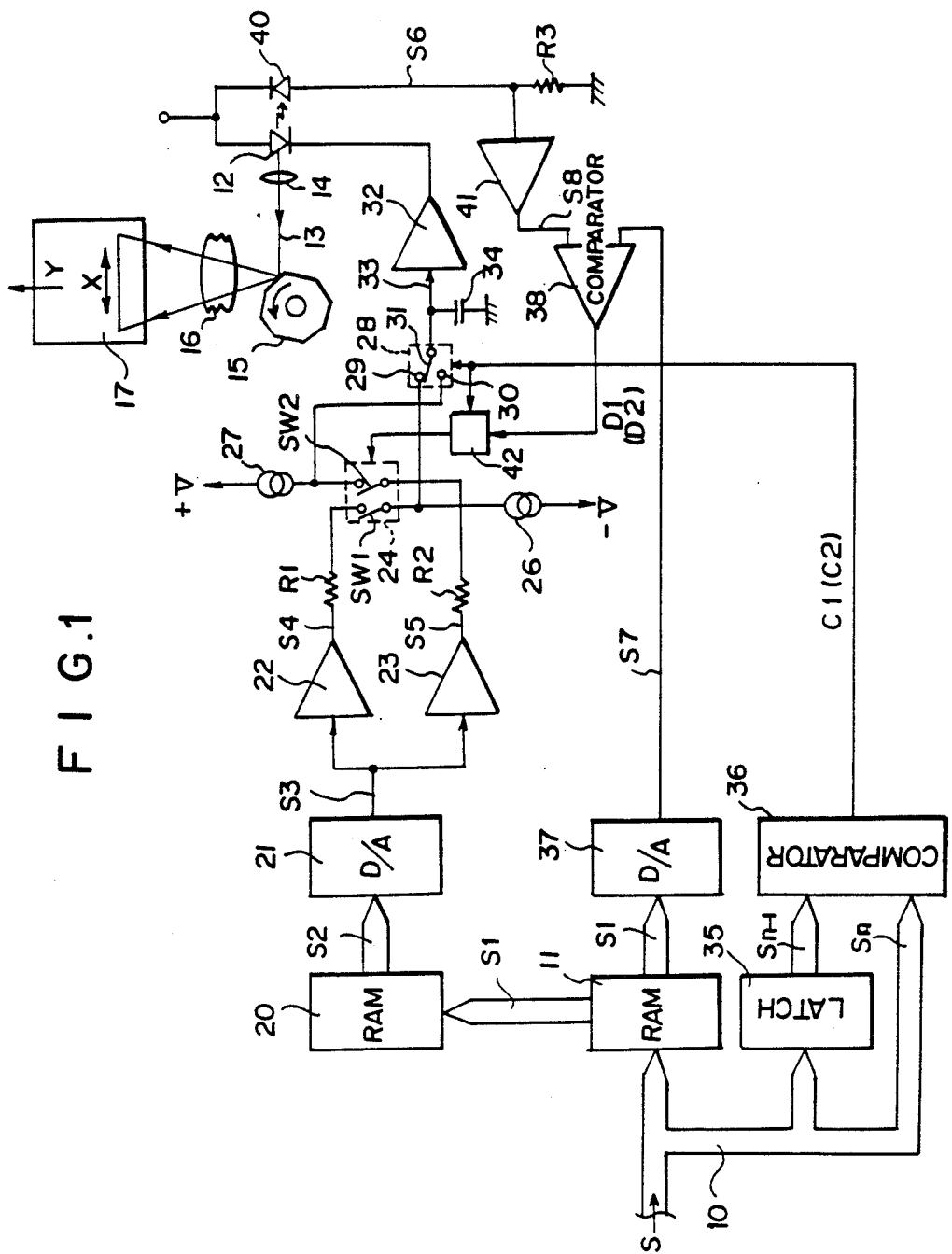
FIG. 1 is a schematic representation of an embodiment of the laser recording apparatus according to the present invention.

FIG. 1 shows an embodiment of the laser recording apparatus according to the present invention. A digital image signal S is supplied from an image data bus 10 to a graduation correction table 11 stored in a RAM or the like. In the table 11, the input signal is subjected to a graduation correction process, which process depends on both the characteristics of a photosensitive material (to be described later) and of a developing unit for developing the photosensitive material. As a result of the process, the table 11 provides an emission light level instruction signal S1. A semiconductor laser 12 emits a light with an intensity represented by the emission light level instruction signal S1 (more specifically light at intensity levels repeatedly increasing and decreasing around an intermediate level corresponding to the signal S1), which will be described later in detail. A light beam 13 emitted from the semiconductor laser 12 is collimated by a collimator lens 14 into a parallel beam. The parallel beam then falls upon a beam deflector 15, e.g. a polygon mirror, which deflects the beam. The deflected light beam 13 is converged by a converging lens 16 consisting of an $f\theta$ lens to make it strike only a very small spot on a photosensitive material 17. The beam, which strikes only a very small spot, is scanned over the photosensitive material in an X-direction (i.e. a main direction). The photosensitive material 17 is fed toward the beam by a feeding means (not shown) in a Y-direction substantially perpendicular to the X- or main scanning direction. In this way, auxiliary scanning of the light beam 13 is effected. The photosensitive material 17 is two-dimensionally scanned by the light beam 13 and thus exposed. The light beam 13 is intensity-modulated according to the image signal S as noted above a photographic latent image generated on the photosensitive material depends on image signal S and thus records a continuous tone image.

Figure 2:
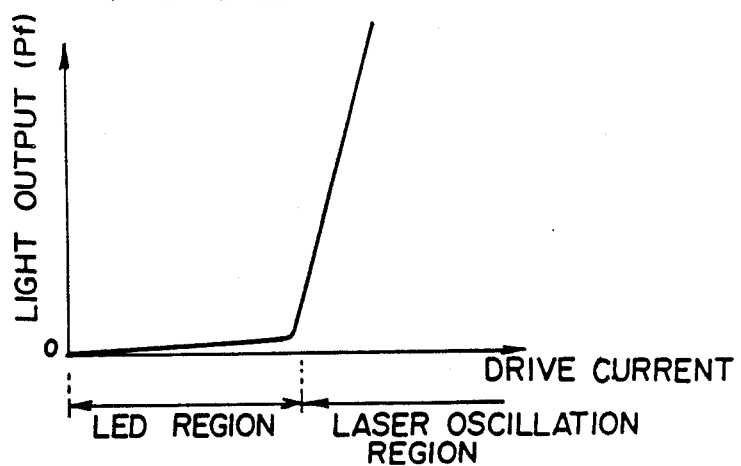
FIG. 2 is a graph showing a drive current versus light output characteristic of a semiconductor laser.
Figure 3:
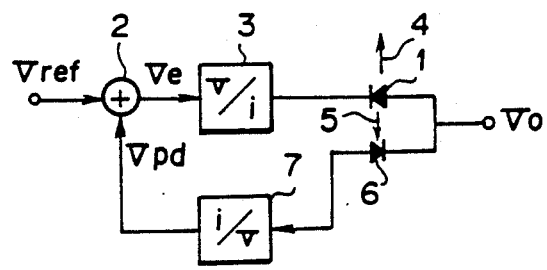
FIG. 3 is a block diagram showing a prior art semiconductor laser light output stabilizer.

The driving of the semiconductor laser 12 will now be described in detail. The emission light level instruction signal S1 is digital and is provided from the graduation correction table 11. The signal S1 is supplied to an I/L characteristic correction table 20 consisting of a RAM or the like. In the table 20, the signal S1 is corrected according to a drive current versus light output characteristic of the semiconductor laser 12 (i.e. a characteristic as shown in FIG. 2) so that table 20 provides a current change rate instruction signal S2 for changing the light output from the semiconductor laser 12 at a pre-determined uniform rate for each graduation in the image density scale. The current change rate instruction signal S2 is supplied to a D/A converter 21 for conversion to an analog current change rate instruction signal S3. The signal S3, which is a voltage signal, is supplied to a non-inverting amplifier 22, which amplifies the input without sign inversion, and also to an inverting amplifier 23, which amplifies the input with sign inversion. The non-inverting amplifier 22 is connected through a resistor R1 to one terminal of a switch SW1 in a ganged switch 24. The inverting amplifier 23 is connected through a resistor R2 to one terminal of the other switch SW2 of the ganged switch 24. Negative and positive current sources 26 and 27 are connected to the other terminals of the respective switches SW1 and SW2. The other terminals of the switches SW1 and SW2 are also connected to respective contacts 29 and 30 of a switch 28. The switch 28 has a movable contact 31 connected to a voltage/current conversion amplifier 32 which serves as a driver circuit to supply a drive current to the semiconductor laser 12. A capacitor 34 has one terminal connected to an input line 33 between the amplifier 32 and switch 28. The other terminal of the capacitor 34 is grounded.

The before-mentioned image data bus 10 is also connected to a latch 35 and to a first comparator 36. The latch 35 progressively latches an image signal S supplied for each image element from the image data bus 10, and it supplies the latched image signal S to the first comparator 36 with a time delay corresponding to the placing of one image element on bus 10. This means that the first comparator 36 is supplied simultaneously timing with an image signal Sn for an n-th image element from the image data bus 10 and an image signal Sn−1 for an (n−1)-th image element, which immediately precedes the n-th image element on the data bus 10. The first comparator 36 compares the two image signal input and provides a "H"-level signal C1 if Sn>Sn−1 while providing an "L"-level signal C2 if Sn≦Sn−1. The signals C1 and C2 are supplied to the switch 28. The first comparator 36 may be arranged such that it provides the signal C1 if Sn=Sn−1.

The digital emission light level instruction signal S1 provided from the graduation correction table 11 is also supplied to a D/A converter 37 for conversion to an analog emission light level instruction signal S7, which is supplied to a second comparator 38. The intensity of the light beam 13 emitted from the semiconductor laser 12 is detected by a photosensor 40, e.g. a PIN photodiode. The photosensor 40 provides a current output S6 which is converted by a resistor R3 into a voltage signal supplied to an amplifier 41. The amplifier 41 provides an output S8 representing the actual emission light level of the semiconductor laser 12. The output S8 is supplied to the second comparator 38. The second comparator 38 compares the output S8 and emission light level instruction signal S7 and, if S8>S7, i.e. if the actual emission light level is above the emission light level instruction value of the emission light level instruction signal S7, it provides a signal D1, while providing a signal D2 otherwise, i.e. if S8≦S7. The signal D1 (or D2) is supplied through an inverter 42 to the ganged switch 24. The second comparator 38 could also be arranged to provide the signal D1 rather than D2 if S8=S7.

Figure 4:
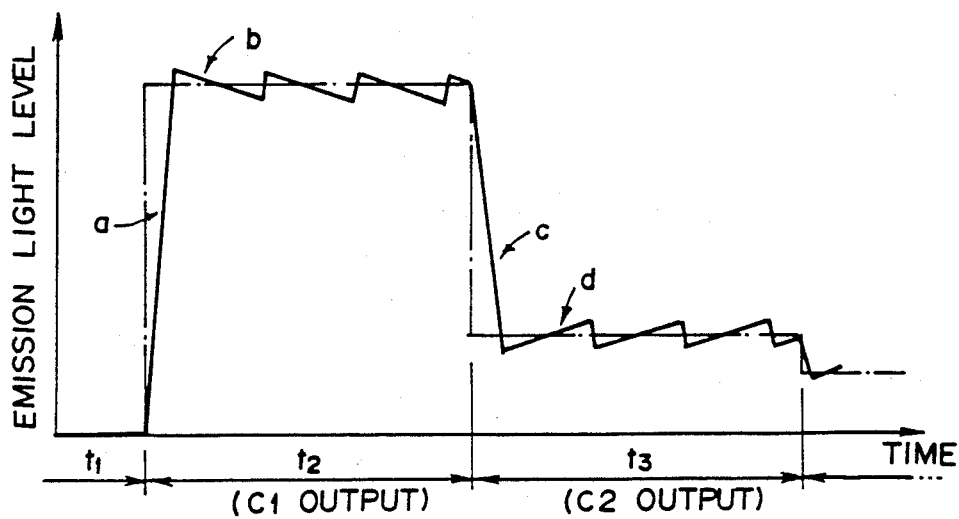
FIG. 4 is a graph showing the relation between the semiconductor laser emission light level and an emission light level instruction signal for an embodiment of the present invention.

Now, the control of the emission light level of the semiconductor laser 12 will be described with reference to FIG. 4. In FIG. 4, time intervals t1, t2, . . . are each one image element write period. The phantom line represents the emission light level instruction value indicated by the emission light level instruction signal S7, and the solid line represents the actual emission light intensity level. When recording a continuous tone image, the emission light level instruction value for a certain image element is either higher or lower than that of the immediately preceding image element.

Now, the time interval t2 will be considered. In this case the image signal inputs Sn−1 and Sn to the first comparator 36 are Sn>Sn−1, so that the first comparator 36 supplies the signal C1 to the switch 28. The movable contact 31 of the switch 28 thus is connected to the contact 29. In an initial stage of the period t2, the actual emission light level of the semiconductor laser 13 is below the emission light level instruction value indicated by the emission light level instruction signal S7, i.e. S8<S7. Thus, the second comparator 38 provides the signal D2. The signals C1 and C2 are also supplied to the inverter 42. While the signal C1 is supplied, the inverter 42 supplies the output signal of the second comparator 38 as such to the ganged switch 24. When the signal D2 is supplied, the ganged switch 24 is operated such that the switches SW1 and SW2 are closed. As a result, the non-inverting amplifier 22 is connected together with the negative current source 26 through the switches SW1 and 28 to the voltage/current conversion amplifier 32. Thus, the current change rate instruction signal S4 (voltage signal) provided from the non-inverting amplifier 22 is converted by the resistor R1 into a current which is passed through the capacitor 34, thus causing the capacitor 34 to be charged quickly. The terminal voltage across the charged capacitor 34 is converted by the voltage/current conversion amplifier 32 into a current for driving the semiconductor laser 12. Since the output signal S4 from the non-inverting amplifier 22 is the current increase rate instruction signal obtained as a result of amplification of the current change rate instruction signal S3 based on the emission light level instruction signal S1 without sign inversion as noted above, the emission light level of the semiconductor laser 12 is increased as shown at arrow a in FIG. 4 until it surpasses the emission light level instruction value indicated by the emission light level instruction signal S7. Consequentially, we have S8>S7, and the second comparator 38 now provides the signal D1 instead of D2. When the signal D1 is provided, the ganged switch 24 is operated such that the switches SW1 and SW2 are opened. Only the negative current source 26 thus is connected to the input line 33 leading to the voltage/current conversion amplifier 32, thus causing the capacitor 34 to be discharged. The input potential to the voltage/current conversion amplifier 32 thus is reduced comparatively gently, that is, the emission light level of the semiconductor laser 12 is gradually reduced as shown at arrow b in FIG. 4. Eventually, we have S8<S7, whereupon the emission light intensity level of the semiconductor laser 12 is quickly increased again. The sequence of operations described above is repeated, so that the emission light level of the semiconductor laser 12 is held close to the value indicated by the emission light level instruction signal S7.

Now, the time interval t3 will be considered, in which the emission light instruction value for a certain image element is low compared to that for the immediately preceding image element. In this case, the image signal inputs Sn−1 and Sn to the first comparator 36 are Sn<Sn−1, so that the first comparator 35 supplies the signal C2 to the switch 28. When the signal C2 is supplied, the movable contact 31 of the switch 28 is connected to the contact 30. In an initial stage of the period t3, the actual emission light level of the semiconductor laser 12 is above the emission light level instruction value indicated by the emission light level instruction signal S7, so that S8>S7. The second comparator 38 thus provides the signal D1. When the signal C2 is provided, the output signal of the second comparator 38 is inverted by the inverter 42 before being supplied to the ganged switch 24. The inverted signal D2 thus is supplied to the ganged switch 24 at this time. The switches SW1 and SW2 of the ganged switch 24 are thus closed, so that the inverting amplifier 23 and the positive current source 27 are connected by switch SW2 to each other and by switch 28 to the voltage/current conversion amplifier 32. Thus, the voltage across the capacitor 34 is reduced to the value corresponding to the current instruction signal S5 (voltage signal) provided from the inverting amplifier 23, and a drive current corresponding to the capacitor voltage is supplied from the voltage/current conversion amplifier 32 to the semiconductor laser 12. The output signal S5 of the inverting amplifier 23 is a current decrease rate instruction signal obtained as a result of amplification of the current change rate instruction signal S3 based on the emission light level instruction signal S1 with sign inversion as noted above. The emission light level of the semiconductor laser 12 becomes lower than the emission light level instruction value shown by the emission light level instruction signal S7 as shown at arrow c in FIG. 4. Consequently, we have S8>S7, and the second comparator 38 provides the signal D2 instead of D1. The signal D2 is inverted by inverter 42, and the switches SW1 and SW2 of the ganged switch 24 are opened in response to inverted signal D2. Thus, the positive current source 27 is connected to the input line 33 leading to the voltage/current conversion amplifier 32, thus causing the charging of the capacitor 34. As a consequence, the input potential to the voltage/current conversion amplifier 32 is increased gradually, and therefore the emission light level of the semiconductor laser 12 is gradually increased as shown at arrow d in FIG. 4. Eventually, we have S8>S7, at which time the emission light level of the semiconductor laser 12 is reduced in the manner described above. The sequence of operations described above is repeated to hold the emission light level of the semiconductor laser 12 close to the value indicated by the emission light level instruction signal S7.

In the above embodiment, the switching circuit for switching of amplifiers 22 and 23 as the input to the voltage/current conversion amplifier 32 according to the signals C1, C2, D1 and D2 is constituted of the ganged switch 24, switch 28 and inverter 42. However, it is possible to use a switching circuit constituted of any other well-known circuits to achieve the same end.

As has been described in the foregoing, with the laser recording apparatus according to the present invention the emission light level of the semiconductor laser can be controlled according to an image signal by making use of the charging and discharging of a capacitor instead of making use of the APC circuit, which is well-known in the art. Thus, the laser recording apparatus according to the present invention is free from the problem of circuit oscillation that arises when using the APC circuit. The present apparatus permits an emission light level instruction signal, which may vary suddenly and often, to be accurately followed by the emission light intensity level of the semiconductor laser. A satisfactory response speed, is thus obtained and it is possible to record a continuous tone image at high speed and with high accuracy.

We claim:

1. A laser recording apparatus for recording a continuous tone image on a photosensitive material by striking the photosensitive material with an intensity-modulated light beam, which light beam is put out by a semiconductor laser, which laser is controlled by a drive current based on an emission light level instruction signal corresponding to an image signal and by scanning said photosensitive material with said light beam, comprising:
   a photosensor for detecting the intensity of said light beam;
   a converter for converting said emission light level instruction signal into a drive current change rate instruction signal for causing the semiconductor laser light output to be a linear function of said image signal and to be changed at a rate proportionate with changes in said emission light level instruction signal;

a non-inverting amplifier for amplifying said drive current change rate instruction signal without sign inversion;

an inverting amplifier for amplifying said drive current change rate instruction signal with sign inversion;

a driver for supplying a drive current, which drive current controls said semiconductor laser;

a first comparator for comparing an image signal for each image element and an image signal for an image element immediately succeeding said each image element in a light beam scanning direction and providing a signal C1 if the former signal is greater than the latter while providing a signal C2 in the converse case;

a second comparator for comparing the semiconductor laser emission light level indicated by said emission light level instruction signal and the actual emission light level indicated by the output of said photosensor and providing a signal D1 if the latter level is greater than the former level while providing a signal D2 in the converse case;

positive and negative current sources;

a capacitor having one terminal connected to an input line of said driver; and a switching circuit for receiving the outputs of said first and second comparators and connecting, to said input line of said driver one of the following: said negative current source when said signals C1 and D1 are being received, said non-inverting amplifier when said signals C1 and D2 are being received, said inverting amplifier when said signals C2 and D1 are being received and said positive current source when said signals C2 and D2 are being received.

* * * * *